(12) United States Patent
Kajita

(10) Patent No.: US 8,278,998 B2
(45) Date of Patent: Oct. 2, 2012

(54) POWER SUPPLY NOISE REDUCTION CIRCUIT AND POWER SUPPLY NOISE REDUCTION METHOD

(75) Inventor: Mikihiro Kajita, Tokyo (JP)

(73) Assignee: NEC Corporation, Tokyo (JP)

( * ) Notice: Subject to any disclaimer, the term of this patent is extended or adjusted under 35 U.S.C. 154(b) by 1496 days.

(21) Appl. No.: 11/237,909

(22) Filed: Sep. 29, 2005

(65) Prior Publication Data

US 2006/0092675 A1    May 4, 2006

(30) Foreign Application Priority Data

Sep. 30, 2004   (JP) .................................. 2004-285691

(51) Int. Cl.
*H04B 1/10* (2006.01)
(52) U.S. Cl. ....................................................... 327/551
(58) Field of Classification Search .................. 327/551, 327/552, 553, 554, 555, 556, 557, 558, 559
See application file for complete search history.

(56) References Cited

U.S. PATENT DOCUMENTS

| | | | | |
|---|---|---|---|---|
| 4,823,092 | A | * | 4/1989 | Pennock ........................ 330/253 |
| 5,384,501 | A | * | 1/1995 | Koyama et al. ............... 327/336 |
| 5,693,988 | A | * | 12/1997 | Bettega et al. ................ 307/105 |
| 5,973,937 | A | | 10/1999 | Yasumura |
| 6,317,016 | B1 | * | 11/2001 | Kuo ............................... 333/215 |
| 6,441,682 | B1 | * | 8/2002 | Vinn et al. ..................... 327/552 |
| 7,271,648 | B2 | * | 9/2007 | Dosho et al. .................. 327/553 |
| 2001/0048342 | A1 | * | 12/2001 | Yoshida et al. ............... 327/552 |
| 2006/0164159 | A1 | * | 7/2006 | Kimura .......................... 327/552 |

FOREIGN PATENT DOCUMENTS

| | | |
|---|---|---|
| JP | 04-132754 | 5/1992 |
| JP | 6-138241 | 5/1994 |
| JP | 7-321470 | 12/1995 |
| JP | 2000-197345 | 7/2000 |
| JP | 2002-016222 | 1/2002 |
| JP | 2002-83920 | 3/2002 |
| JP | 2002-305248 | 10/2002 |
| JP | 2003-258612 | 9/2003 |

OTHER PUBLICATIONS

Canadian Office Action dated Feb. 22, 2007.
Japanese Office Action dated Dec. 11, 2007 (with partial English translation).

* cited by examiner

*Primary Examiner* — Lincoln Donovan
*Assistant Examiner* — Khareem E Almo
(74) *Attorney, Agent, or Firm* — McGinn IP Law Group, PLLC

(57) ABSTRACT

A power supply noise reduction circuit and a power supply noise reduction method for reducing power supply noise at any frequency, includes forcing a power supply noise to resonate to the resonance frequency of a parallel resonance circuit, including an inductor and a capacitor to set the frequency of the noise equal or close to the resonance frequency of the parallel resonance circuit and, attenuating the noise, set equal or close to the resonance frequency of the parallel resonance circuit, using a low-pass filter including a resistor and a capacitor.

31 Claims, 17 Drawing Sheets

STRUCTURE OF POWER SUPPLY OF THIS INVENTION

| V | POWER SUPPLY (VDD) PAD |
| G | GND (VSS) PAD |
| ▨ | PARALLEL RESONANCE CIRCUIT |

STRUCTURE OF CONVENTIONAL POWER SUPPLY

POWER SUPPLY NOISE REDUCTION CIRCUIT AND POWER SUPPLY NOISE REDUCTION METHOD

BACKGROUND OF THE INVENTION

1. Field of the Invention

The present invention relates to a power supply noise reduction circuit and a power supply noise reduction method, and more particularly to a power supply noise reduction circuit and a power supply noise reduction method that reduce power supply noise generated by switching a current source.

2. Description of the Related Art

Today, as LSI (Large scale integration circuit) chips get faster, power supply noise reduces the margin of the design of delay, sometimes causing an analog circuit to malfunction.

More specifically, a current flow, which is generated each time a transistor such as a CMOS (Complementary metal oxide semiconductor) is switched on or off, causes a fluctuation in the power supply. Such a power supply fluctuation, if any, could change the delay amount of a gate in a logical path and, as a result, the delay of the path itself changes depending upon the amount of power supply fluctuation. When a circuit is designed, this fluctuation amount must be taken into consideration. However, when the power supply fluctuation amount cannot be suppressed to a desired value, the delay margin is decreased and, in the worst case, there is no window available for use in transmission.

In an analog circuit, the power supply is sometimes used to create a medium potential that is used in the circuit. Therefore, if this medium potential changes, the behavior of the circuit itself changes with a possibility that the circuit does not operate as designed.

An increase in the speed of an LSI and a decrease in the power supply voltage tend to increase a change in the current amount. As the change in the current amount increases, the noise amount (power supply fluctuation amount) $\Delta V$ (proportional to the product of inductance component L of power supply and current change di/dt) also increases.

Conventionally, an on-chip decoupling capacitor is mainly used to reduce such power supply noise. The capacitance of a gate is usually used as the decoupling capacitor. However, to allow this decoupling capacitor with the capacitance of a gate to process noise including a high-frequency noise, there is a tradeoff between the necessity to reduce the gate length and the decrease in the capacitance efficiency per unit area.

On the other hand, an increase in the on-chip capacitors results in an increase in the chip size and increases the chip cost. In view of this, there is a need for a method, other than the method of increasing on-chip capacitors, for efficiently suppressing the power supply fluctuation at a low cost.

One of the inventions for reducing this noise is disclosed in Patent Document 1. The invention disclosed in Patent Document 1 relates to a bypass capacitor on a printed circuit board or an LSI package. In this Patent Document 1, because the effect of a capacitor is weakened if a power supply bypass capacitor is away from an LSI, a series resonance circuit is inserted in parallel to the bypass capacitor to decrease the impedance for the noise of a specific frequency. This configuration allows the noise component corresponding to the setup "specific frequency" to pass through the series resonance circuit, places the bypass capacitor virtually nearer, and suppresses the fluctuation in the power supply potential.

Other related art technologies for this problem are disclosed in Patent Documents 2-4.

[Patent Document 1] Japanese Patent Laid-Open Application No. 2002-83920 (paragraphs 0007-008, FIG. 1)

[Patent Document 2] Japanese Patent Laid-Open Application No. 2003-258612

[Patent Document 3] Japanese Patent Laid-Open Application No. Hei 06-138241

[Patent Document 4] Japanese Patent Laid-Open Application No. Hei 07-321470

However, according to the invention disclosed in Patent Document 1, it is difficult to design filtering for power supply noise unless the noise components are known, which is usually difficult to predict. Actually, however, because a noise includes many frequency components and what frequency noise affects an LSI depends on the LSI operation, it is difficult to predict it in the design stage. Therefore, an exemplary problem is that the noise cannot be decreased sufficiently. Patent Documents 2-4 also fails to disclose means for solving this problem.

SUMMARY OF THE INVENTION

In view of the foregoing and other exemplary problems, drawbacks and disadvantages, it is an exemplary feature of the present invention to provide a power supply noise reduction circuit and a power supply noise reduction method that can reduce power supply noise at any frequency.

To solve the exemplary and other problems described above, a power supply noise reduction circuit according to the present invention is a power supply noise reduction circuit for reducing noise generated in a power supply comprising the power supply, a resonance circuit, and a filter.

The resonance circuit of the power supply noise reduction circuit according to the present invention is a parallel resonance circuit connected in series with the power supply. The resonance frequency of the parallel resonance circuit of the power supply noise reduction circuit according to the present invention is higher than the frequency of the noise. The filter of the power supply noise reduction circuit according to the present invention attenuates resonance frequency components of the parallel resonance circuit.

An exemplary power supply noise reduction method according to the present invention is a power supply noise reduction method for reducing noise generated in a power supply, including forcing a resonance circuit, connected to the power supply, to resonate for setting a frequency of the noise equal or close to a resonance frequency; and attenuating the power supply noise, set equal or close to the resonance frequency, using a filter connected in series with the resonance circuit.

With such an exemplary structure and method, the present invention forcibly induces resonance in a power supply to resonate power supply noise to a predetermined resonance frequency and attenuates the noise with a low-pass filter.

BRIEF DESCRIPTION OF THE DRAWINGS

The novel exemplary features believed characteristic of the invention are set forth in the appended claims. The invention itself, however, as well as other exemplary features and advantages thereof, will be best understood by reference to the detailed description which follows, read in conjunction with the accompanying, wherein:

DESCRIPTION OF THE EXEMPLARY EMBODIMENTS

Exemplary embodiments of the present invention will be described below with reference to the attached drawings. In the description of the embodiments below, a power supply noise reduction circuit according to the present invention is compared with a conventional power supply noise reduction circuit for convenience.

First Exemplary Embodiment

Figure 1:
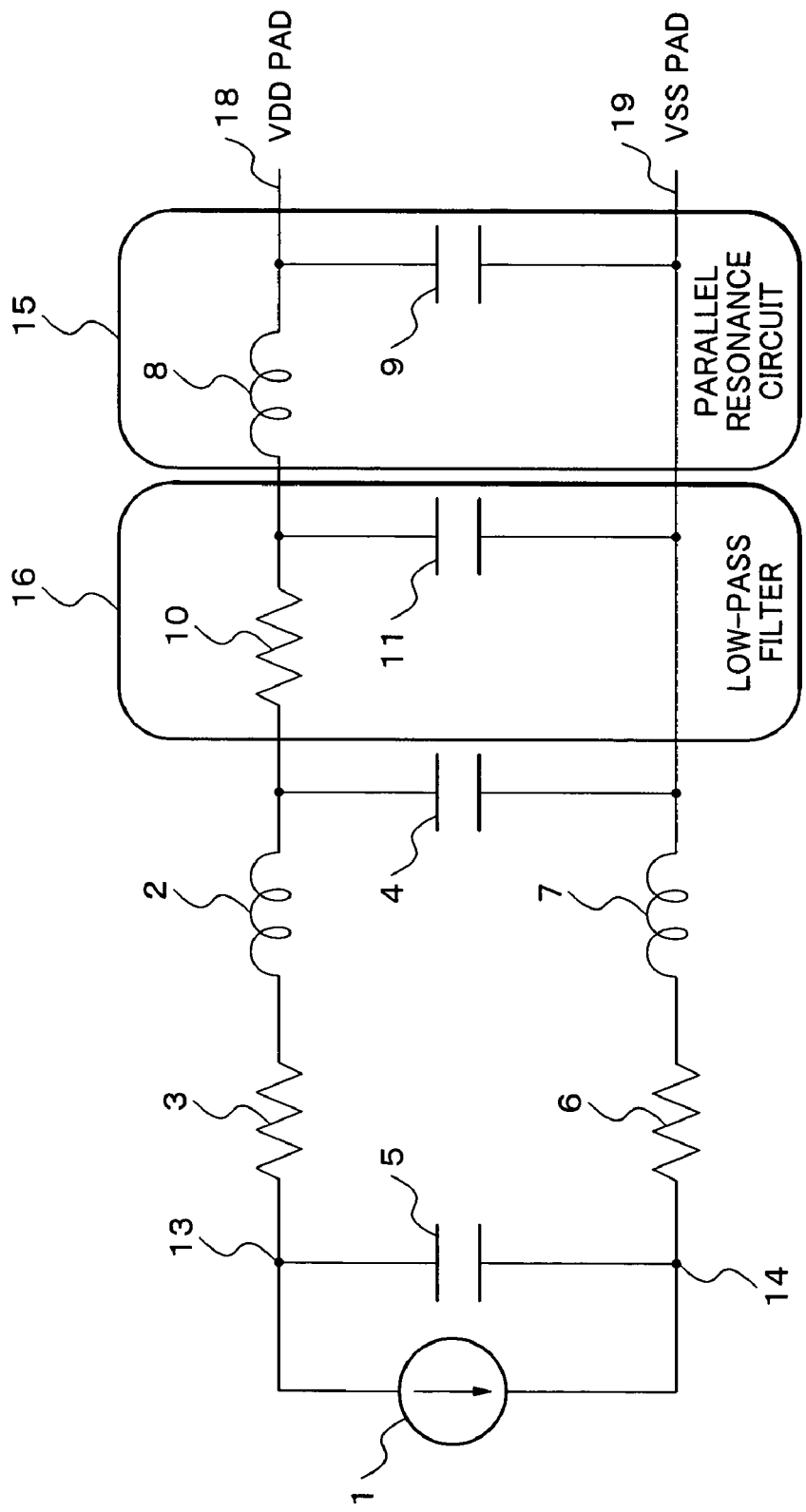
FIG. 1 is a circuit diagram showing an example of a power supply unit including a power supply noise reduction circuit according to the present invention.
Figure 11:
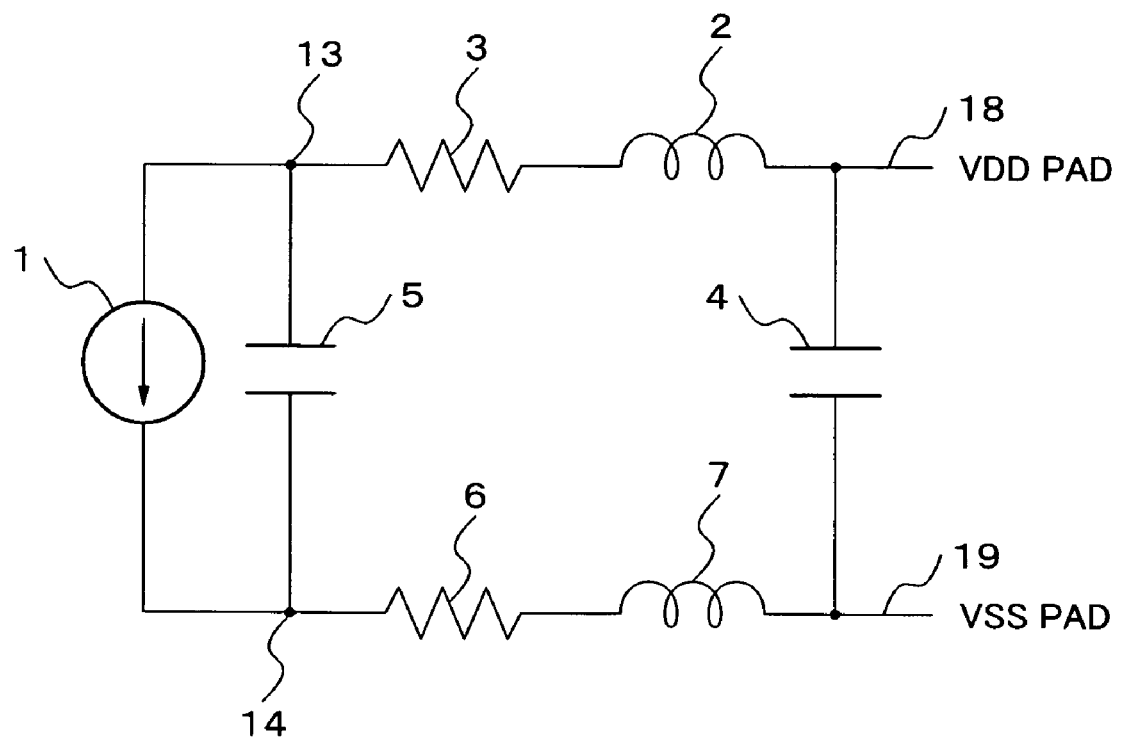
FIG. 11 is a circuit diagram showing an example of a conventional power supply unit.

FIG. 1 is a circuit diagram showing an example of a power supply unit including a power supply noise reduction circuit according to the present invention, and FIG. 11 is a circuit diagram showing an example of a conventional power supply unit.

First, an example of a conventional power supply unit will be described. As shown in FIG. 11, the example of a conventional power supply unit comprises a current source 1, an inductor 2, a resistor 3, a capacitor 4, a capacitor 5, a resistor 6, and an inductor 7. This power supply unit further comprises a VDD pad (positive voltage output terminal) 18 and a VSS pad (negative voltage output terminal) 19.

The resistor 3 and the inductor 2 are connected in series between a terminal 13 of the current source 1 and the VDD pad 18, and the resistor 6 and the inductor 7 are connected in series between a terminal 14 of the current source 1 and the VSS pad 19.

In addition, the capacitor 5 is connected between the terminal 13 and the terminal 14 of the current source 1, and the capacitor 4 is connected between the VDD pad 18 and the VSS pad 19.

An example of the current source 1 is a transistor (LSI) As shown in the figure, the transistor 1 indicated by the current source is arranged between the VDD pad 18 and the VSS pad 19. This arrangement causes a current to flow from the VDD pad 18 to the VSS pad 19 each time switching occurs, generating a power supply "bounce". This power supply bounce becomes a power supply noise that adversely affects an electronic circuit, not shown in FIG. 1, connected to the VDD pad 18 and the VSS pad 19.

To reduce this power supply noise, the capacitor 5 is connected to both ends of the transistor 1 as a decoupling capacitor. That is, by setting the capacitance of the capacitor 5 so that the reactance of the capacitor 5 is decreased sufficiently at a desired frequency, most of the power supply noise passes through the capacitor 5 and is grounded. This prevents the power supply noise from outputting to an external unit via the VDD pad 18 and the VSS pad 19.

In FIG. 11, the following are assumed as an example: inductors 2 and 7=30 pH, resistors 3 and 6=1Ω, capacitor 4=0.3 pF. For the current source 1, ΔI=10 mA, Tr/Tf (rise time/fall time)=100 ps, and decoupling capacitor (capacitor 5)=400 pF are assumed.

Figure 12:
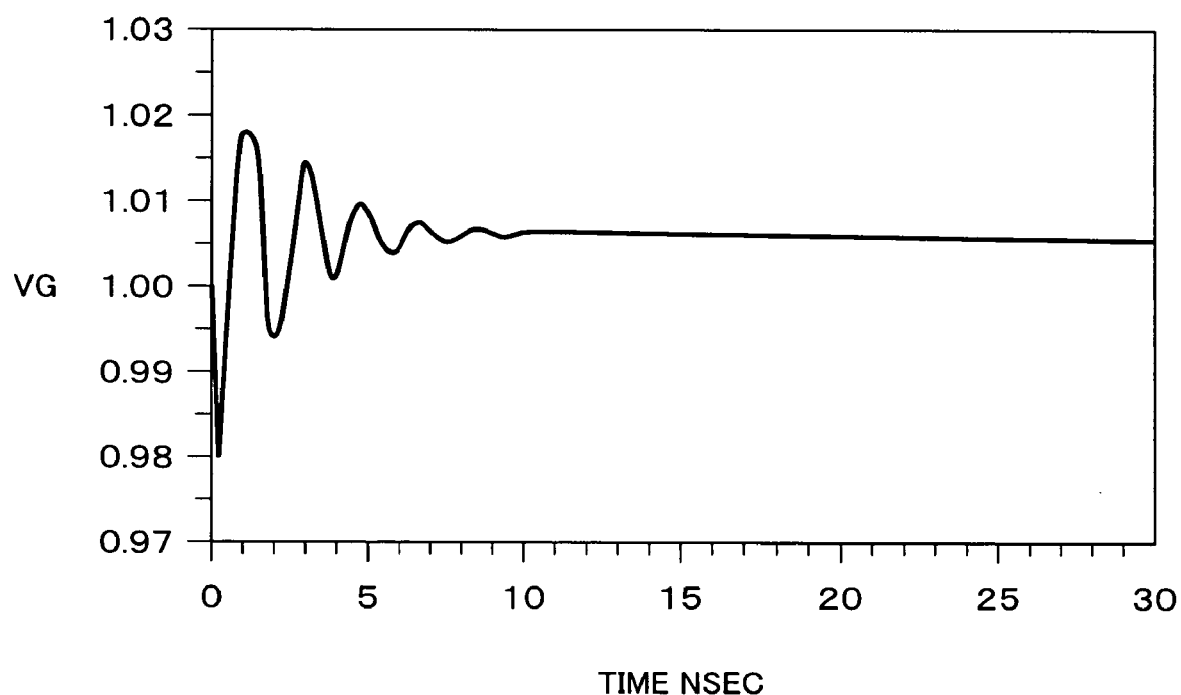
FIG. 12 is a graph showing an example of the amount of power supply noise in the conventional power supply unit shown in FIG. 11.

FIG. 12 is a graph showing an example of the amount of power supply noise generated in the conventional power supply unit shown in FIG. 11. The vertical axis indicates the voltage (V), and the horizontal axis indicates the time (nsec.). The noise waveform (power supply fluctuation) of the conventional power supply unit shown in FIG. 11 is as shown in FIG. 12, with the peak noise amount being about 37 mV. This is a case when the power supply voltage is 1.0V.

Next, an example of a power supply unit according to the present invention will be described with reference to FIG. 1. In the figure, the same reference numerals as those in FIG. 11 denote the same structural elements and the description of those elements is omitted.

The example of the power supply unit according to the present invention includes a current source 1, an inductor 2, a resistor 3, a capacitor 4, a capacitor 5, a resistor 6, an inductor 7, a low-pass filter 16, and a parallel resonance circuit 15. The power is supplied to an electronic circuit, not shown in FIG. 1, via a VDD pad (positive voltage output terminal) 18 and a VSS pad (negative voltage output terminal) 19.

The low-pass filter 16 includes a resistor 10 and a capacitor 11, and the parallel resonance circuit 15 includes an inductor 8 and a capacitor 9. This low-pass filter 16 and the parallel resonance circuit 15 form a power supply noise reduction circuit.

As shown in FIG. 1, the low-pass filter 16 and the parallel resonance circuit 15 are connected in series with the conventional power supply unit (including the current source 1, inductors 2 and 7, resistors 3 and 6, and capacitors 4 and 5).

Figure 15:
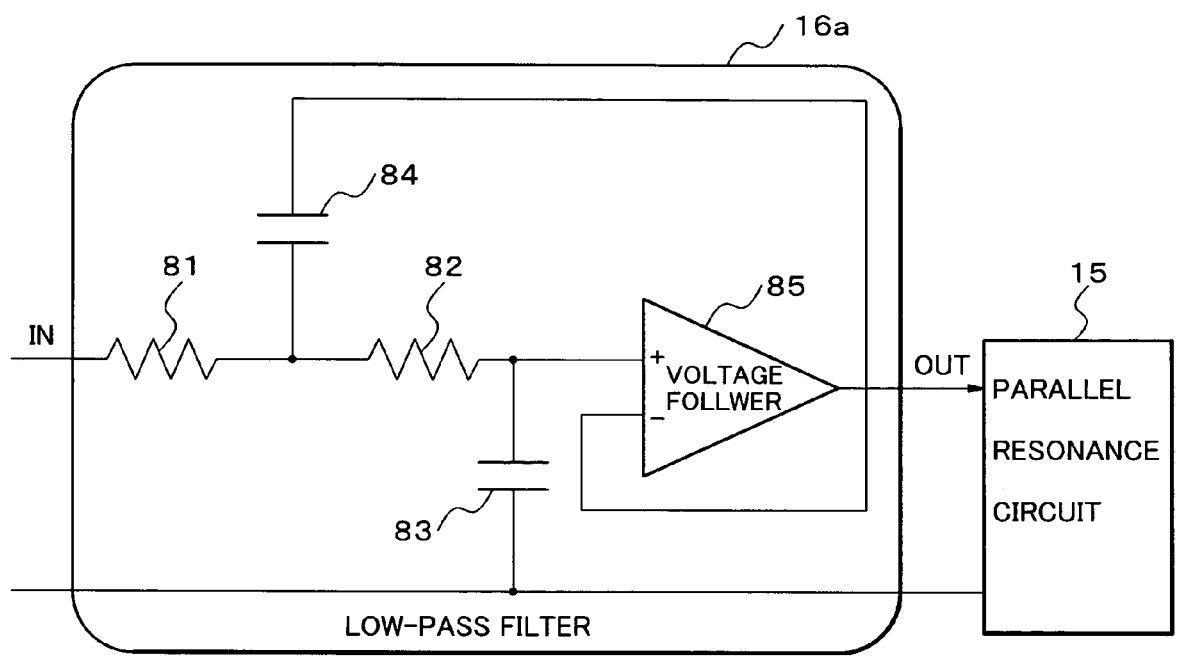
FIG. 15 is a circuit diagram showing an example of the low pass filer included in the power supply noise reduction circuit according to the present invention.

The low-pass filter of the present invention is not limited to the configuration of a low-pass filter 16 shown in FIG. 1. A low-pass filter 16a shown in FIG. 15 can be used for the present invention. The low-pass filter 16a includes resisters 81 and 82, capacitors 83 and 84, and voltage follower 85. The configuration of the low-pass filter 16a provides an effect to allow the cutoff frequency accuracy of the low-pass filter 16a to be better than that of the low-pass filter 16.

Figure 16:
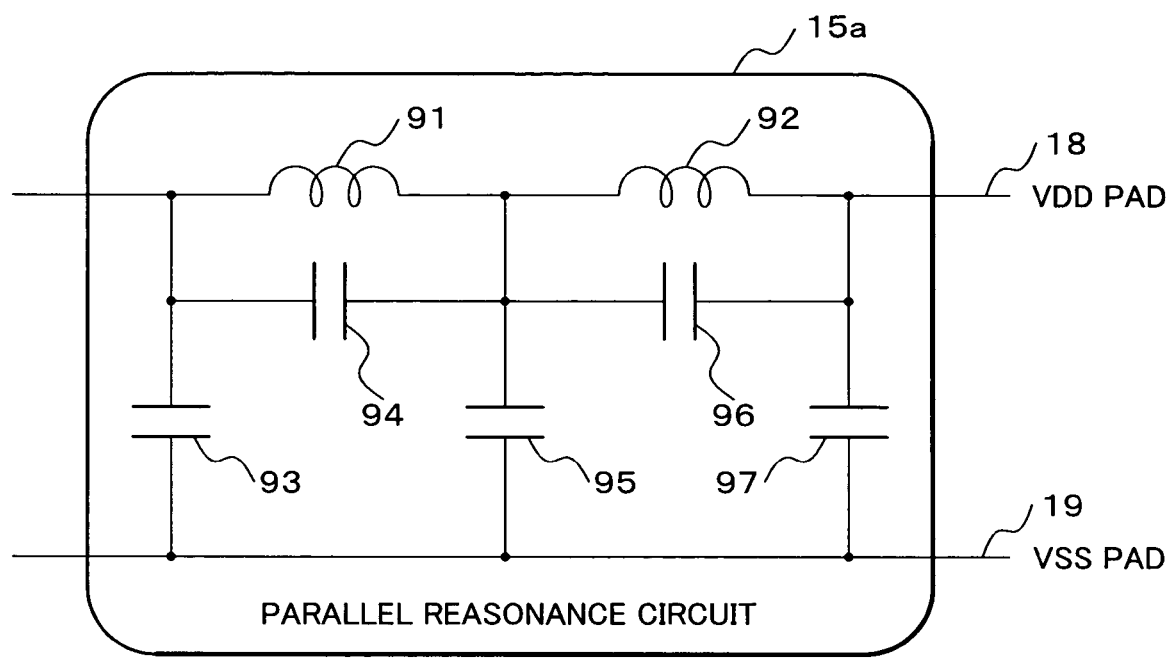
FIG. 16 is a circuit diagram showing an example of the parallel resonance circuit included in the power supply noise reduction circuit according to the present invention.

The parallel resonance circuit of the present invention is not limited to the configuration of the he parallel resonance circuit. A parallel resonance circuit 15a shown in FIG. 16 can be used for this invention. The parallel resonance circuit 15a includes inductors 91 and 92, and capacitors 93, 94, 95, 96 and 97.

Figure 17:
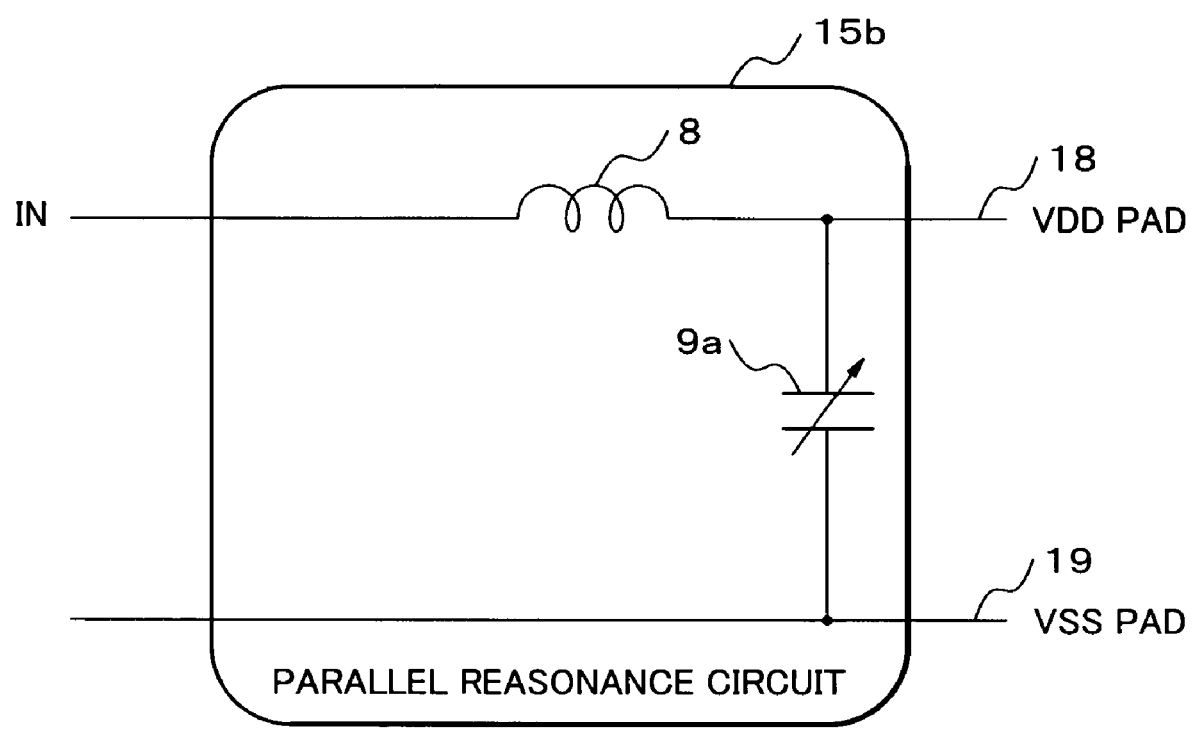
FIG. 17 is a circuit diagram showing an example of the parallel resonance circuit included in the power supply noise reduction circuit according to the present invention.

Also, a parallel resonance circuit 15b shown in FIG. 17 can be used instead of the parallel resonance circuit 15 shown in FIG. 1. The parallel resonance circuit 15b includes an inductor 8 and a variable capacitor 9a. A varactor can be used as a variable capacitor 9a. This configuration allows the resonance frequency of the parallel resonance circuit to be adjustable.

These low-pass filters and parallel resonance circuits can be arbitrarily combined.

Figure 2:
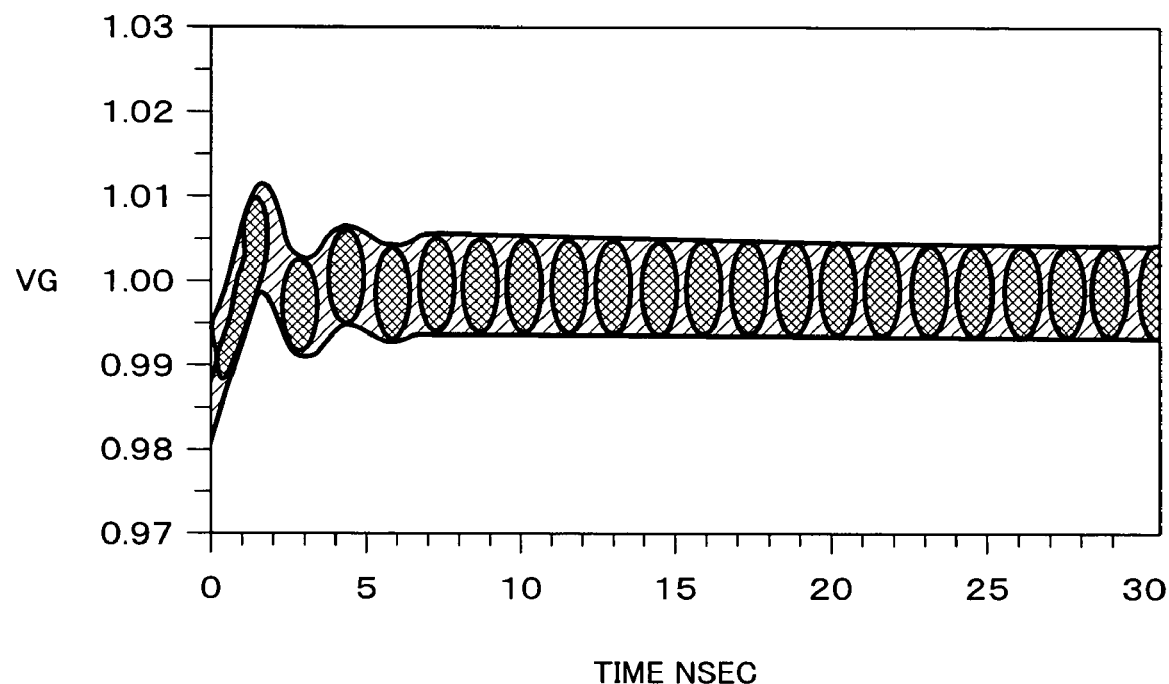
FIG. 2 is a graph showing the amount of power supply noise when the exemplary power supply noise reduction circuit according to the present invention is forced to resonate.
Figure 3:
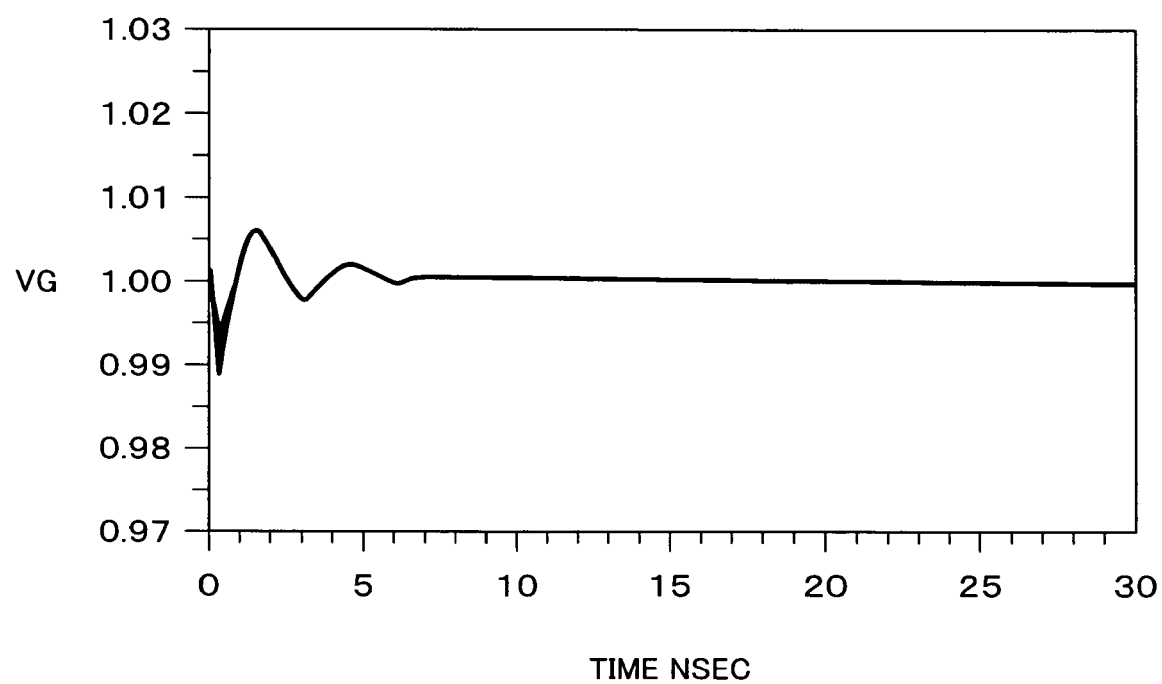
FIG. 3 is a diagram showing the amount of power supply noise after the noise passes through a low-pass filter.

Next, the operation of the power supply noise reduction circuit according to the present invention will be described. FIG. 2 is a graph showing the amount of power supply noise generated when the exemplary power supply noise reduction circuit according to the present invention is forced to resonate, and FIG. 3 is a graph showing the amount of power supply noise after the noise passes through the low-pass filter.

The power supply noise usually includes a plurality of frequency components. It is necessary that the resonance frequency of the parallel resonance circuit 15 be higher than the clock frequency of an electronic circuit such as a core logic circuit in a LSI chip shown in FIG. 7, connected via the VDD and the VSS, as much as possible. This is required to prevent the electronic circuit from being affected by the parallel resonance and from malfunctioning. Usually higher harmonic noise whose frequency is a twice, 4 times, 8 times - - - as much as a system clock frequency can come up. Noise having up to 4 times frequency component as much as a system clock frequency has a significant influence on signal to noise ratio margin. However, 8 times of a system clock frequency has little influence on signal to noise ratio margin.

Therefore, if resonant frequency is twice to 4 times of the system clock frequency, the invention has some effect but specially careful design is required. If resonant frequency is 5 to 8 times of the system clock frequency, the invention has sufficient effect with ordinary design. If resonant frequency is more than 9 times of the system clock frequency, sufficient effect of the invention can be realized without any consideration on the design.

For example, it is desirable to add, to the output terminals of the power supply, low-pass filter and parallel resonance circuit tuned to a frequency higher than noise frequency (preferably 5-6 times the clock frequency).

Considering the requirement of the resonance frequency described above, the inductor and the capacitor of the parallel resonance circuit 15 are set up, for example, as follows: inductor 8=50 pH and capacitor 9=50 pF.

Figure 4:
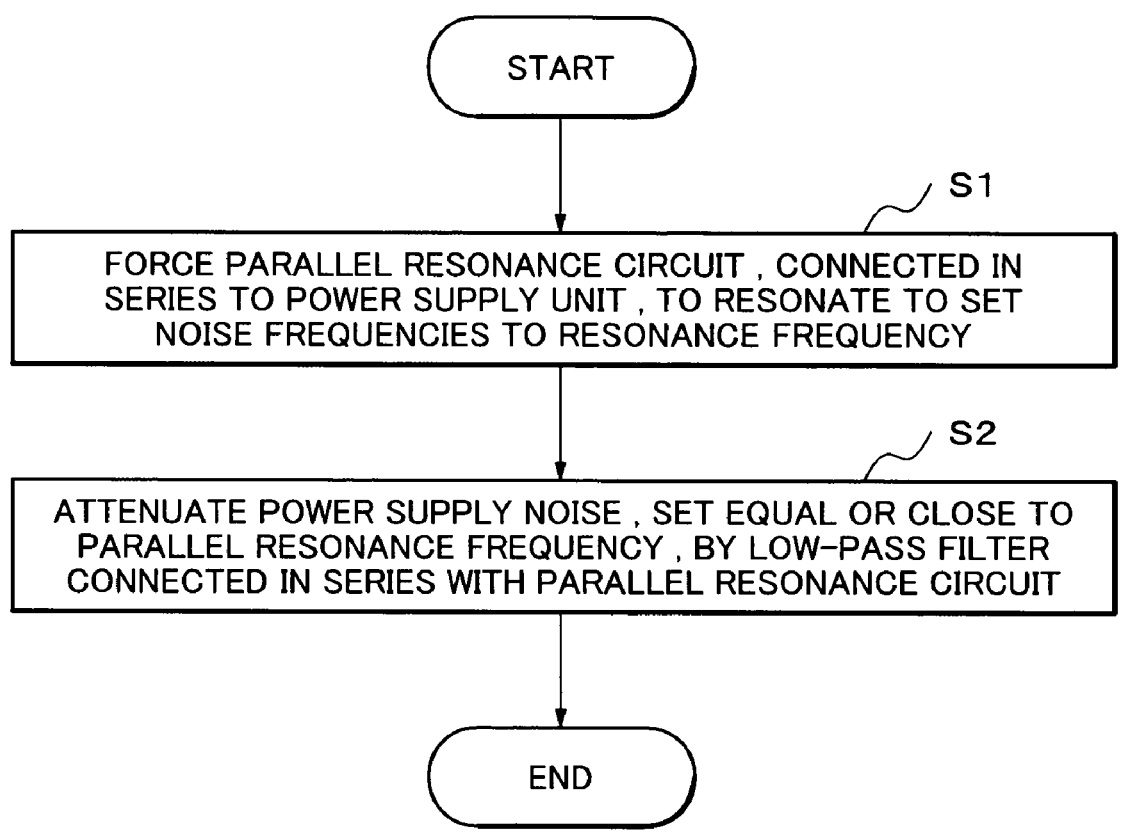
FIG. 4 is a flowchart showing the operation of an exemplary noise reduction method used in the noise reduction circuit according to the present invention.

FIG. 2 is a graph showing the frequency components of power supply noise when the noise reduction circuit according to the present invention is forced to resonate, FIG. 3 is a graph showing the frequency components of power supply noise after the power supply noise passes through the low-pass filter after the resonance, and FIG. 4 is a flowchart showing the operation of the noise reduction method in the exemplary noise reduction circuit according to the present invention. In FIG. 2 and FIG. 3, the vertical axis indicates the voltage (V) and the horizontal axis indicates the time (nano sec.).

First, the parallel resonance circuit 15 connected in series with the power supply unit is forced to resonate to set the noise frequencies equal or close to the resonance frequency of the parallel resonance circuit 15 (step S1 in FIG. 4). By setting the values as described above, the frequency components of the power supply noise of the parallel resonance circuit 15 at resonance time are as shown in FIG. 2. Referring to FIG. 2, the peak noise amount is about 25 mV that is much smaller than the peak noise amount (about 37 mV) in the above-described conventional power supply unit shown in FIG. 12.

Next, the power supply noises set equal or close to the parallel resonance frequency are attenuated by the low-pass filter 16 connected in series with the parallel resonance circuit 15 (step S2 in FIG. 4). Then, as shown in FIG. 3, the peak noise amount is further reduced to about 16 mV.

As a result, the power supply unit according to the present invention can reduce the exemplary power supply noise to about ½ or lower than that of the conventional power supply unit.

Figure 5:
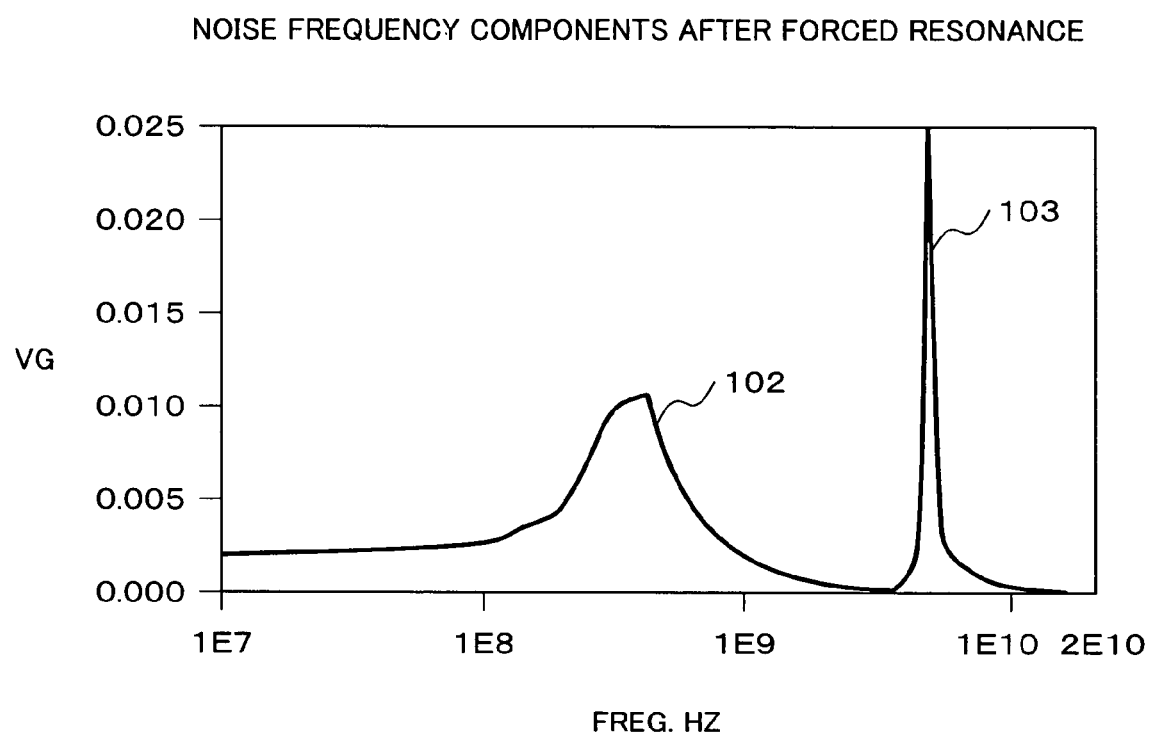
FIG. 5 is a graph showing the frequency characteristics of power supply noise when the exemplary power supply noise reduction circuit according to the present invention is forced to resonate.
Figure 6:
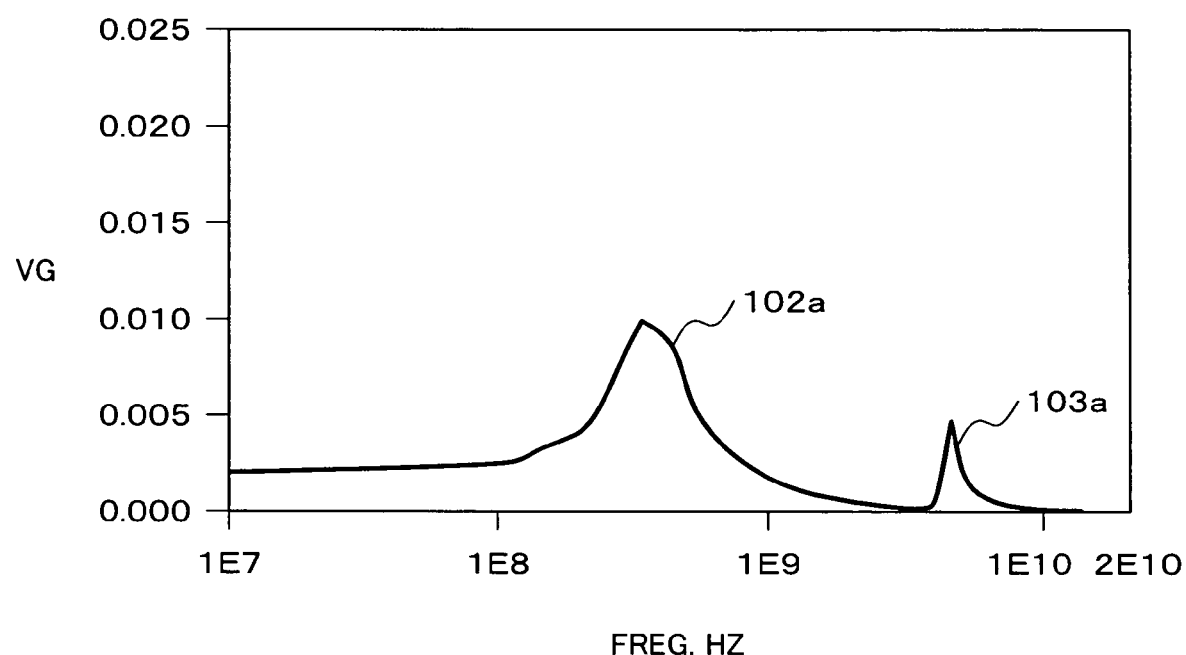
FIG. 6 is a graph showing the frequency characteristics power supply noise after the noise passes through the low-pass filter after the resonance.
Figure 13:
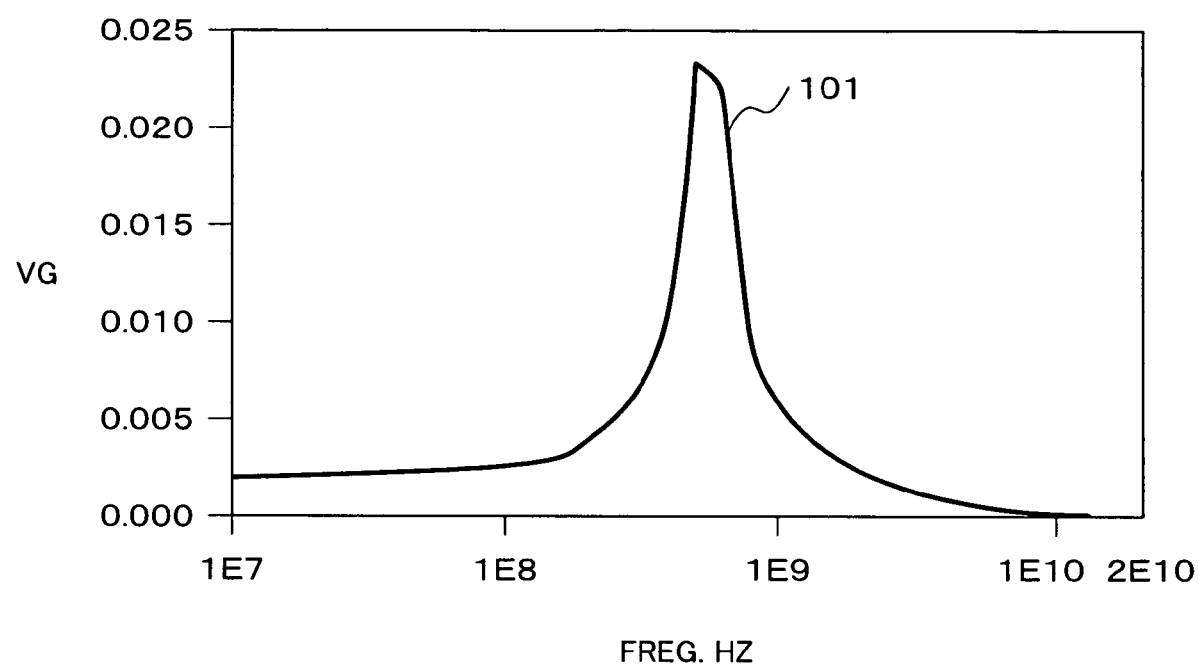
FIG. 13 is a graph showing the frequency characteristics of power supply noise in the conventional power supply unit.

FIG. 5 is a graph showing the frequency characteristics of power supply noises when the power supply noise reduction circuit according to the present invention is forced to resonate, FIG. 6 is a graph showing the frequency characteristics of power supply noises after the noises pass through the low-pass filter after the resonance, and FIG. 13 is a graph showing the frequency characteristics of power supply noises generated by the conventional power supply unit. In FIG. 5, FIG. 6, and FIG. 13, the vertical axis indicates the magnitude (mag) and the horizontal axis indicates the frequency (Hz).

Next, with reference to FIG. 5, FIG. 6, and FIG. 13, the operation of the exemplary power supply noise reduction circuit according to the present invention will be described more in detail.

FIG. 13 shows the frequency characteristics of power supply noise 101 in the conventional power supply unit. Referring to the figure, the peak of the power supply noise 101 occurs at the midpoint between 100 M Hz and 1 G Hz with the level being about 0.023 mag.

On the other hand, FIG. 5 shows that, when the power supply noise reduction circuit according to the present invention is forced to resonate, the level of the power supply noise 101 shown in FIG. 13 is reduced to the level of power supply noise 102 and, in addition, new power supply noise 103 (the level is 0.025 mag. or higher) of the resonance frequency occurs at a frequency (around the midpoint between 1 G Hz and 10 G Hz) higher than that of the power supply noise 102. The reason why the level of the power supply noise 102 (about 0.010 mag.) is significantly reduced from the level of the original power supply noise 101 is that the energy of the original power supply noise 101 is shifted to the power supply noise 103 of the resonance frequency. On the other hand, FIG. 6 shows that the power supply noise 103 of the resonance frequency, which passes through the low-pass filter 16, is attenuated (about 0.005 mag.) and that the power supply noise is at the level indicated by 103a.

As described above, a significant noise reduction effect is achieved by causing resonance to shift the energy of the power supply noise, whose peak is originally in the low-frequency region (see FIG. 13), to the resonance frequency in the high frequency region (see FIG. 5) and then by attenuating the power supply noise at the resonance frequency with the use of the low-pass filter (see FIG. 6).

More specifically, parallel resonance, if caused, significantly increases the impedance of the power supply at the resonance frequency. Because the power supply current multiplied by the impedance of the power supply is the power supply voltage fluctuation, the power supply voltage fluctuation increases as the impedance increases. That is, the power supply noise increases.

That is, when parallel resonance is caused, the impedance of the power supply increases at the resonance frequency and the power supply noise at the resonance frequency also increases. When this parallel resonance is forced to induce in the power supply, the impedance at other frequencies is relatively reduced and the impedance at the resonance frequency is increased. Therefore, the power supply noise at the resonance frequency greatly increases, and the power supply noise at other frequencies is reduced.

As described above, the first exemplary embodiment of the present invention has a configuration in which the parallel resonance forces the power supply noise components to be shifted to the parallel resonance frequency, which the low pass filter then attenuates.

Second Exemplary Embodiment

Figure 7:
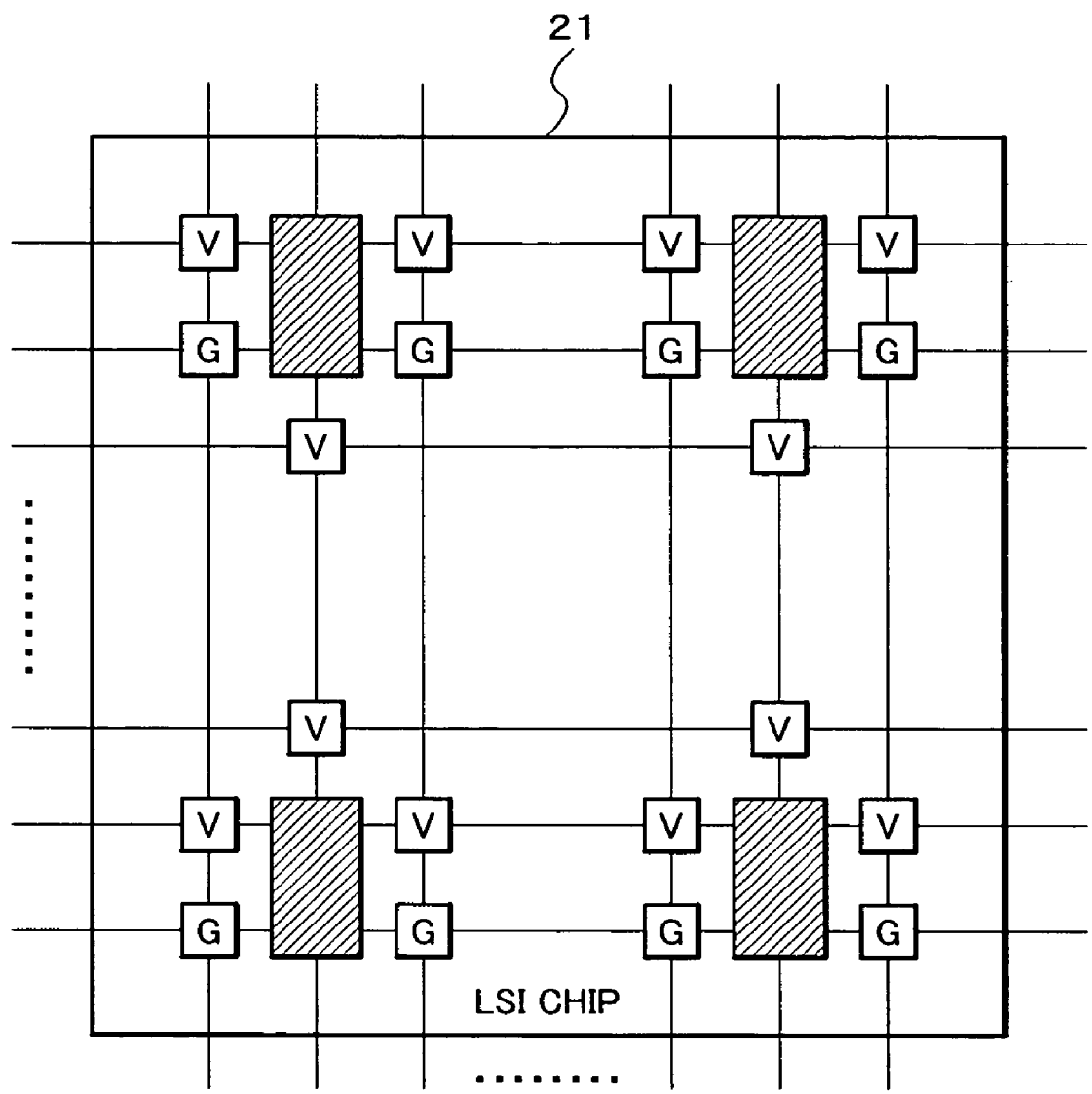
FIG. 7 is a diagram showing an example in which resonance generators are arranged among power supply (VDD) pads and GND (VSS) pads in an LSI chip.

FIG. 7 is a diagram showing an example in which resonance generators are arranged among power supply (VDD) pads 18 and GND (VSS) pads 19 in an LSI chip. As shown in the figure, the power supplies are arranged in a grid form in an LSI chip. Although the series resonance circuit disclosed in Patent Document 1 described above cannot be inserted into such a circuit, the power supply noise reduction circuit according to the present invention can be inserted.

FIG. 7 shows an example in which the parallel resonance circuits 15 in the first embodiment are arranged among a plurality of power supply (VDD) pads 18 and GND (VSS) pads 19 in an LSI chip, one parallel resonance circuit for each plurality of VDD and VSS pads. Although not shown in FIG. 7, the low-pass filter 16 in the first embodiment is inserted in series with the parallel resonance circuit in the actual configuration.

Figure 14:
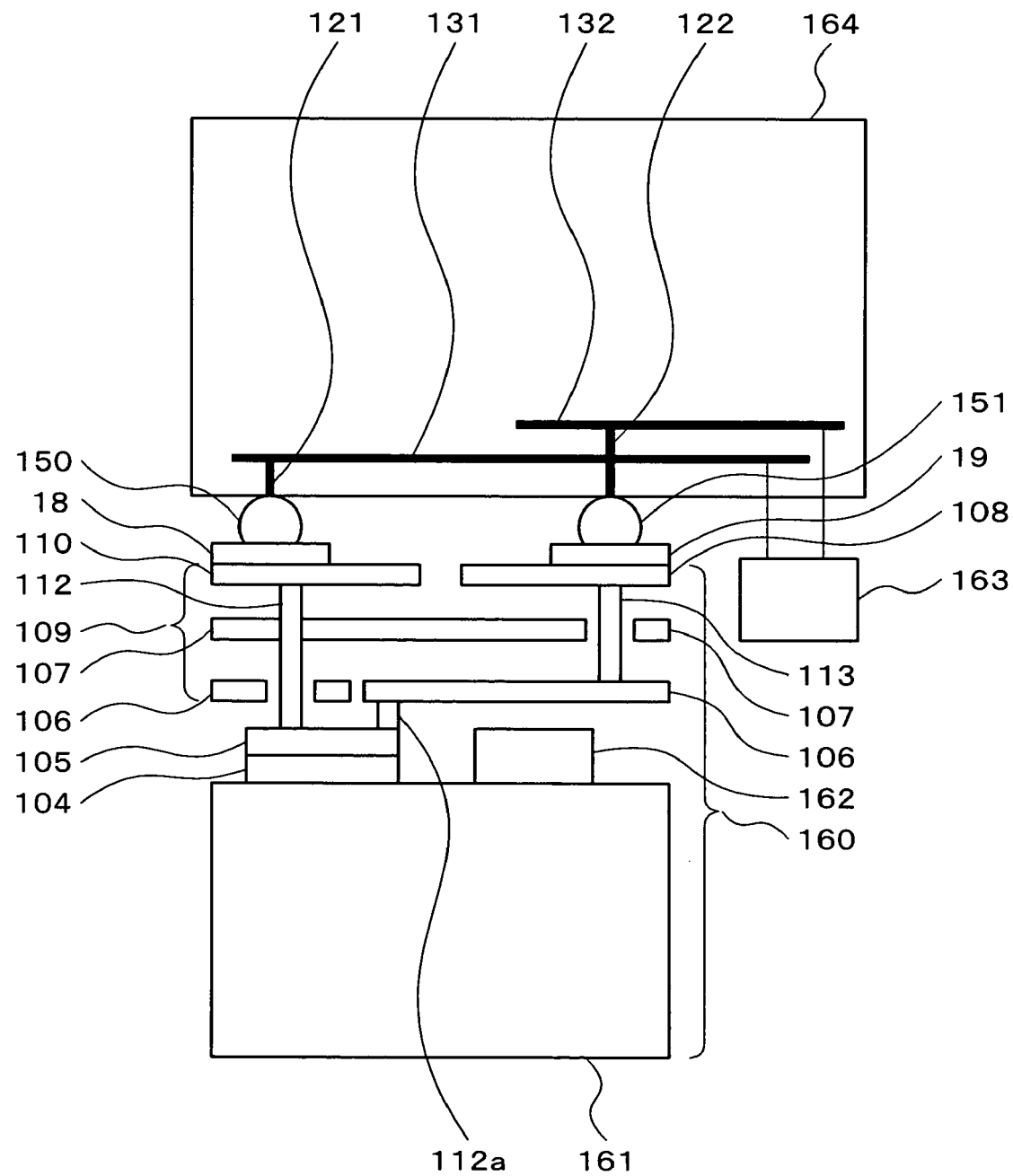
FIG. 14 is a cross section diagram showing an example in which a resonance generation circuit is arranged among the power supply (VDD) pad and the GND (VSS) pad in an LSI chip.

FIG. 14 is a cross section diagram showing an example in which the resonance generation circuit is arranged among a power supply (VDD) pad 18 and a GND (VSS) pad 19 in an LSI chip 21. In an LSI 160, a CMOS 162, a low-pass filter 104 (corresponds to the low-pass filter 16 in FIG. 1), and a parallel resonance circuit 105 (corresponds to the parallel resonance circuit 15 in FIG. 1) are arranged on an Si substrate 161, and they are connected each other via their adjacent parts. The CMOS 162 and the low-pass filter 104 are connected via a wiring metal layer, not shown, provided between the Si substrate 161 and the power supply pads VDD and VSS.

Metal layers 109 (power supply metal 107 and ground metal 106) and wiring metal layers, not shown, are provided between the parallel resonance circuit 105 and the power supply pads VDD 18 and VSS 19, and the layers and the power supply pads are connected via VIA holes. One end of the parallel resonance circuit 105 is connected to the power supply pad VDD 18 via the VIA hole 112 and through the power supply metals 107 and 110, and is connected to a DC power supply 163 through a soldering bump 150, a VIA hole 121, and a power supply layer 131. The VIA holes 121 and 122, the power supply layer 131, and a ground layer 132 are included in a printed circuit board 164. Similarly, the other end of the parallel resonance circuit 105 is connected to the power supply pad VSS 19 via a VIA hole 112a and through the ground metal 106, the VIA hole 113, and a ground metal 108, and is connected to the DC power supply 163 via a soldering bump 151, the VIA hole 122, and the ground layer 132.

In the configuration described above, the second exemplary embodiment gives the same effect as that of the first exemplary embodiment (see FIG. 3). The LSI chip shown in FIG. 1, about 100 μm in size, does not take up much space. Because the frequency characteristics are set to the resonance frequency, the circuit need not be designed for many frequencies.

Third Exemplary Embodiment

Figure 8:
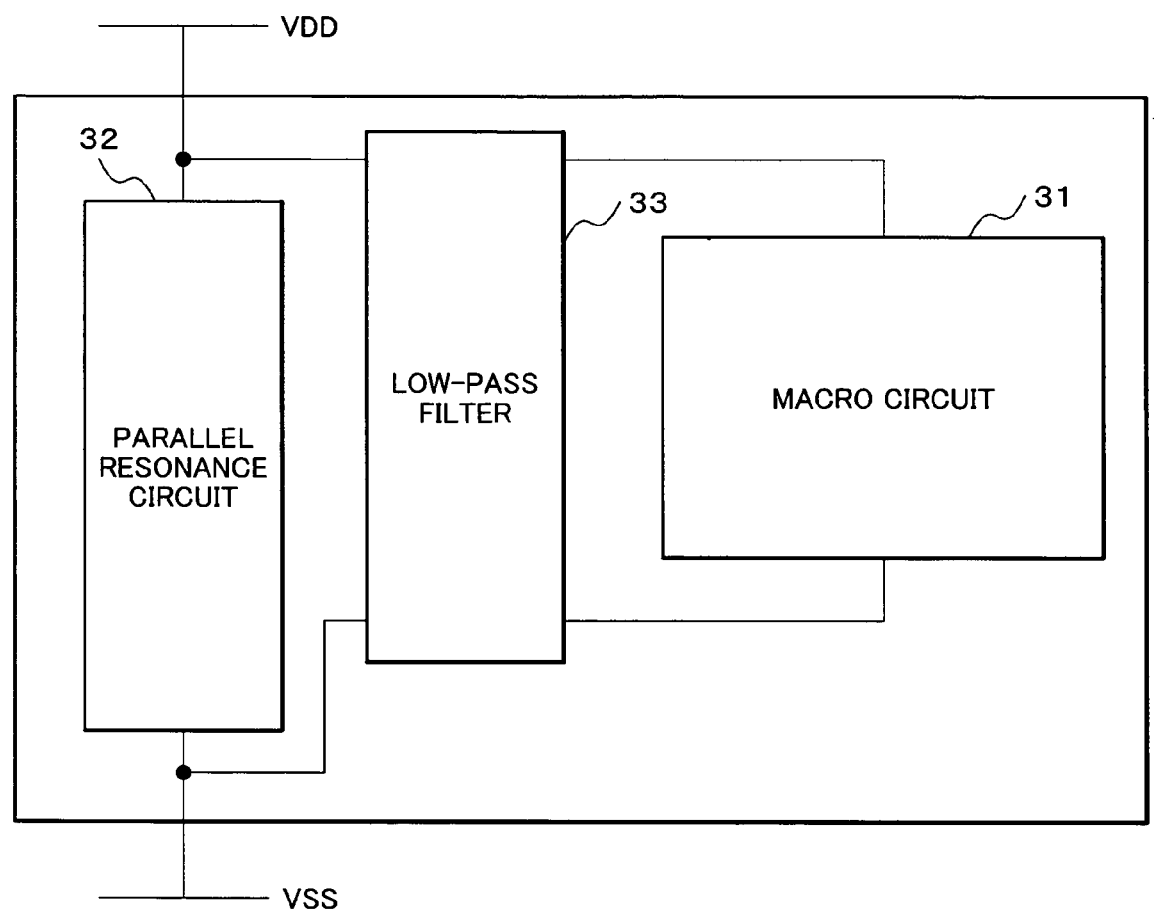
FIG. 8 is a configuration diagram showing an example in which the power supply noise reduction circuit according to the present invention is applied to a macro circuit.

FIG. 8 is a configuration diagram showing an example in which the power supply noise reduction circuit according to the present invention is applied to a macro circuit. A "macro circuit" refers to a circuit block with a special function that is built in a chip, such as a RAM (random access memory) circuit or a SerDes (serial-deserial) circuit.

Referring to FIG. 8, a parallel resonance circuit 32, a low-pass filter 33, and a macro circuit 31 are connected in series to a power supply not shown. The parallel resonance circuit 32 has the same configuration as that of the parallel resonance circuit 15 in the first exemplary embodiment, and the low-pass filter 33 has the same configuration as that of the low-pass filter 16 in the first embodiment.

With the macro circuit 31 arranged as shown in FIG. 8, this power supply noise reduction circuit (parallel resonance circuit 32+low-pass filter 33) is inserted between the macro circuit 31 and an external power supply as if it was a regulator circuit. This configuration implements a low-noise power supply that gives a great advantage especially when the macro circuit is an analog circuit.

A usual regulator circuit requires an extra power supply, which is provided externally and whose power supply voltage is higher than that of the power supply voltage, and also requires a much larger space. By contrast, the circuit according to the present invention, if used as an alternative to such a usual regulator circuit, requires only a power supply at a single voltage level and reduces an increase in the additional space to about 1/10.

Fourth Exemplary Embodiment

Figure 9:
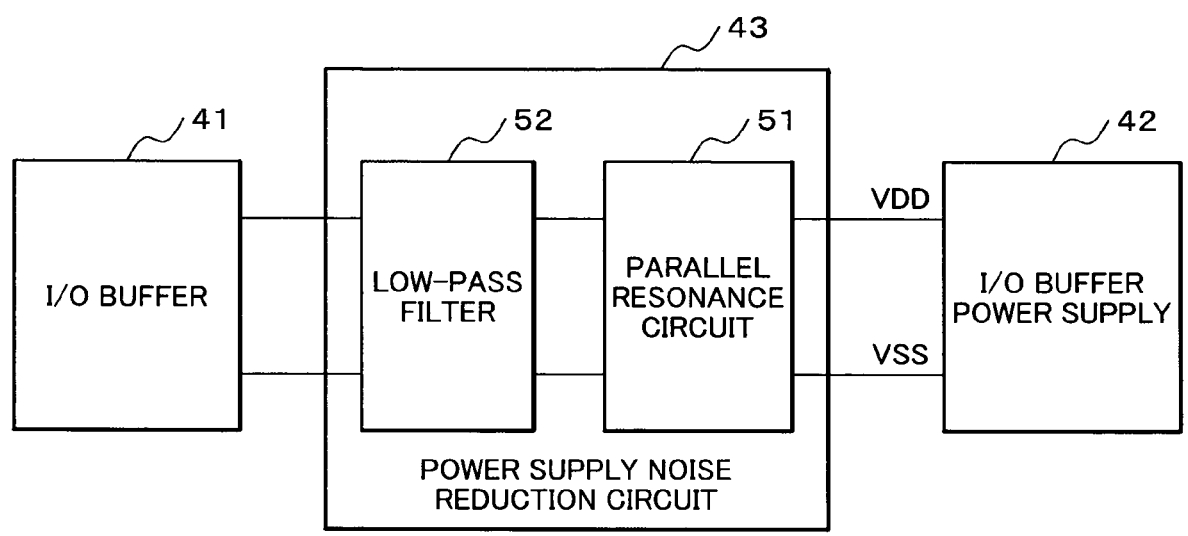
FIG. 9 is a configuration diagram showing an example in which the power supply noise reduction circuit according to the present invention is applied to an I/O buffer.

FIG. 9 is a configuration diagram showing an example in which the power supply noise reduction circuit according to the present invention is applied to an I/O buffer. Referring to FIG. 9, a power supply noise reduction circuit 43 is connected between an I/O buffer 41 and an I/O buffer power supply 42. The power supply noise reduction circuit 43 comprises a parallel resonance circuit 51 and a low-pass filter 52 that are connected in series, the parallel resonance circuit 51 has the same configuration as that of the parallel resonance circuit 15 in the first exemplary embodiment, and the low-pass filter 52 has the same configuration as that of the low-pass filter 16 in the first embodiment.

A fluctuation, if caused in the power supply 42 of the I/O buffer 41, generates a jitter (waveform distortion) when the signal is transmitted. As the transmission data rates become higher, the transmission margin is decreased and the transmission distance and the link speed are restricted.

The application of the power supply noise reduction circuit 43 according to the present invention could reduce the fluctuation in the power supply, suppresses the jitter, and increases the transmission margin.

It is difficult to connect a decoupling capacitor to the I/O buffer 41 because of the configuration of the I/O buffer 41. Therefore, the power supply noise reduction circuit according to the present invention can be applied to such a circuit.

Fifth Exemplary Embodiment

When a digital circuit and an analog circuit use a common power supply, a noise in the clock of the digital circuit sometimes causes a malfunction in the analog circuit. Therefore, the digital circuit and the analog circuit conventionally use separate power supplies. The fifth exemplary embodiment solves this problem.

Figure 10:
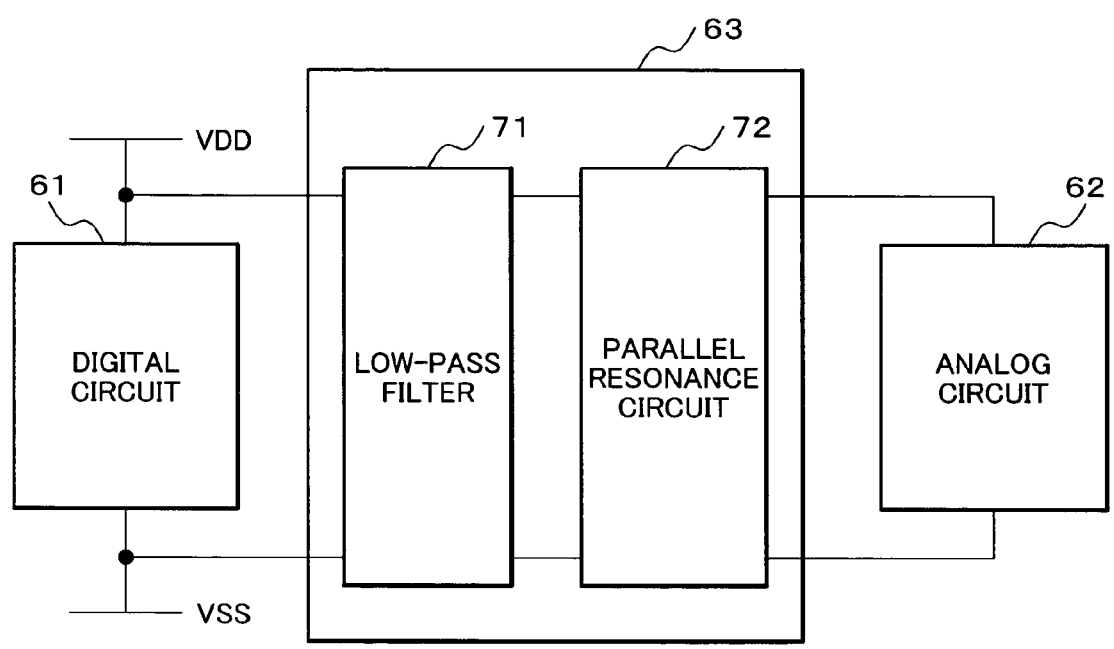
FIG. 10 is a configuration diagram showing an example in which the power supply noise reduction circuit according to the present invention is used in a common power supply of a digital circuit and an analog circuit.

FIG. 10 is a configuration diagram showing an example in which the power supply noise reduction circuit according to the present invention is used in the common power supply of a digital circuit and an analog circuit.

Referring to FIG. 10, a power supply noise reduction circuit 63 is connected between a digital circuit 61 and an analog circuit 62. The digital circuit 61 and the analog circuit 62 are connected to a common power supply not shown.

The power supply noise reduction circuit 63 comprises a parallel resonance circuit 72 and a low-pass filter 71 that are connected in series, the parallel resonance circuit 72 has the same configuration as that of the parallel resonance circuit 15 in the first embodiment, and the low-pass filter 71 has the same configuration as that of the low-pass filter 16 in the first embodiment.

An example of the digital circuit 61 is a logic circuit, and an example of the analog circuit 62 is a PLL (phase locked loop) circuit.

Connecting the power supply noise reduction circuit 63 between the digital circuit 61 and the analog circuit 62 as described above prevents the analog circuit 62 from being affected by a noise caused by a clock from the digital circuit 61. Of course, both the digital circuit 61 and the analog circuit 62 are not affected by the power supply noise shown in the first embodiment.

The power supply noise reduction circuit according to the present invention, which includes the power supply, the resonance circuit, and the filter, can reduce power supply noise at any frequency.

That is, the power supply reduction circuit according to the present invention can significantly reduce the amount of power supply noise that is usually generated and suppress the effect of a power supply fluctuation on the circuits, especially on the circuits vulnerable to noise, in an LSI. This avoids a decrease in the delay margin caused by a circuit malfunction and a delay fluctuation. In addition, other than a power supply noise, a substrate noise that propagates through a silicon substrate is generated in a usual LSI. Even if this noise is caused, this noise can be combined into the power supply noise by causing resonance.

While this invention has been described with reference to illustrative exemplary embodiments, this description is not intended to be construed in a limiting sense. Various modifications of the illustrative embodiments as well as other embodiments of the invention, will be apparent to persons skilled in the art upon reference to this description. It is, therefore, contemplated that the appended claims will cover any such modifications or embodiments as fall within the true scope of the invention.

Further, it is the inventor's intent to retain all equivalents of the claimed invention even if the claims are mended during prosecution.

What is claimed is:

1. A power supply noise reduction circuit for reducing noise generated in a power supply, said power supply noise reduction circuit comprising:
    said power supply;
    a resonance circuit, providing a means for resonating a noise in said power supply for setting a frequency of the noise equal or close to a resonance frequency; and
    a filter, providing a means for attenuating the power supply noise and being set equal to close to the resonance frequency,
    wherein said resonance circuit comprises a parallel resonance circuit, and said resonance circuit and said filter are connected in series with said power supply, said parallel resonance circuit and said filter being tuned to frequencies related in a predetermined manner to a predetermined clock frequency, and said noise being reduced comprises a noise generated in said power supply, as caused by a switching at said predetermined clock frequency, and said noise is reduced by said resonance circuit shifting an energy of said noise to a different frequency and said filter then attenuating said shifted energy.

2. The power supply noise reduction circuit according to claim 1, wherein a resonance frequency of said parallel resonance circuit is higher than a frequency of the noise.

3. The power supply noise reduction circuit according to claim 2, wherein said filter attenuates resonance frequency components of said parallel resonance circuit.

4. The power supply noise reduction circuit according to claim 3, wherein an electric current source supplying an electric current to said power supply comprises an LSI (Large Scale Integration) circuit.

5. The power supply noise reduction circuit according to claim 4, wherein said power supplies are arranged in a grid form in an LSI chip.

6. The power supply noise reduction circuit according to claim 3, wherein said power supply is connected to a macro circuit, said power supply and said macro circuit being fabricated on a same integrated circuit chip.

7. The power supply noise reduction circuit according to claim 3, wherein said power supply is connected to an I/O (Input/Output) buffer, said power supply and said I/O buffer being fabricated on a same integrated circuit chip.

8. The power supply noise reduction circuit according to claim 3, wherein said power supply comprises a power supply common to a digital circuit and an analog circuit, said power supply, said digital circuit, and said analog circuit being fabricated on a same integrated circuit chip.

9. The power supply noise reduction circuit according to claim 3, wherein said parallel resonance circuit comprises an inductor and a capacitor connected in parallel and said filter comprises a low-pass filter comprising a resistor and a capacitor.

10. The power supply noise reduction circuit according to claim 1, wherein a resonance frequency of said parallel resonance circuit is higher than a clock frequency of an electronic circuit externally connected via a power supply terminal.

11. An electronic circuit noise reduction circuit for reducing noise generated in an electronic circuit, said noise reduction circuit comprising:
    a resonance circuit, providing a means for resonating a noise in said power supply for setting a frequency of the noise equal or close to a resonance frequency; and
    a filter, providing a means for attenuating the power supply noise and being set equal to close to the resonance frequency,
    wherein said resonance circuit comprises a parallel resonance circuit connected in series with a power supply, said resonance circuit and said filter being tuned to frequencies related in a predetermined manner to a predetermined clock frequency, and said noise being reduced comprises a noise generated in said power supply, as caused by a switching at said predetermined clock frequency, and said noise is reduced by said resonance circuit shifting an energy of said noise to a different frequency and said filter then attenuating said shifted energy.

12. The electronic circuit noise reduction circuit according to claim 11, wherein a resonance frequency of said parallel resonance circuit is higher than a frequency of the noise.

13. The electronic circuit noise reduction circuit according to claim 12, wherein said filter attenuates resonance frequency components of said parallel resonance circuit.

14. A power supply noise reduction method for reducing noise generated in a power supply, comprising:
    forcing a resonance circuit, connected to said power supply, to resonate for setting a frequency of the power supply noise equal or close to a resonance frequency, as achieved by a means for resonating a noise in said power supply for setting a frequency of the noise equal or close to a resonance frequency; and
    attenuating the power supply noise, set equal or close to the resonance frequency, using a filter connected in series with said resonance circuit, as achieved by a means for attenuating the power supply noise and being set equal to close to the resonance frequency,
    said resonance circuit and said filter being tuned to frequencies related in a predetermined manner to a predetermined clock frequency, and said noise being reduced comprises a noise generated in said power supply, as caused by a switching at said predetermined clock frequency, and said noise is reduced by said resonance circuit shifting an energy of said noise to a different frequency and said filter then attenuating said shifted energy.

15. The power supply noise reduction method according to claim 14, wherein said resonance circuit comprises a parallel resonance circuit connected in series with said power supply.

16. The power supply noise reduction method according to claim 14, wherein a resonance frequency of said parallel resonance circuit is higher than a frequency of the noise generated in said power supply.

17. The power supply noise reduction method according to claim 16, wherein said filter attenuates resonance frequency components of said parallel resonance circuit.

18. The power supply noise reduction method according to claim 17, wherein an electric current source supplying an electric current to said power supply comprises an LSI (Large Scale Integrated) circuit.

19. The power supply noise reduction method according to claim 18, wherein said power supplies are arranged in a grid form in an LSI chip.

20. The power supply noise reduction method according to claim 17, wherein said power supply is connected to a macro circuit.

21. The power supply noise reduction method according to claim 17, wherein said power supply is connected to an I/O buffer.

22. The power supply noise reduction method according to claim 17, wherein said power supply comprises a power supply common to a digital circuit and an analog circuit.

23. The power supply noise reduction method according to claim 17, wherein said parallel resonance circuit comprises an inductor and a capacitor connected in parallel and said filter comprises a low-pass filter comprising a resistor and a capacitor.

24. A power supply noise reduction device for reducing noise generated in a power supply, comprising:
    means for resonating the power supply noise for setting a frequency of the noise equal or close to a resonance frequency; and
    means for attenuating the power supply noise, set equal or close to the resonance frequency, connected in series with said means for resonating the power supply noise,
    said means for resonating and said means for attenuating being tuned to frequencies related in a predetermined manner to a predetermined clock frequency, and said noise being reduced comprises a noise generated in said power supply, as caused by a switching at said predetermined clock frequency, and said noise is reduced by said means for resonating shifting an energy of said noise to a different frequency and said means for attenuating then attenuating said shifted energy.

25. The power supply noise reduction circuit of claim 1, wherein said power supply comprises:
    a current source;
    a first capacitor connected in parallel to said current source;
    a first inductor and a first resistor serially interconnected, and connected at a first end to a first terminal of said current source;
    a second inductor and a second resistor serially interconnected, and connected at a first end to a second terminal of said current source; and
    a second capacitor connected between a second end of said serially-interconnected first inductor and first resistor and a second end of said serially-interconnected second inductor and second resistor.

26. The power supply noise reduction circuit of claim 10, wherein said resonance frequency and said design frequency of said low-pass filter are set to be within a range of five to six times said clock frequency.

27. The power supply noise reduction circuit of claim 1, wherein said parallel resonance circuit comprises:
    a first resonance circuit input node and a second resonance circuit input node;
    a first resonance circuit output node and a second resonance circuit output node,
        wherein said second resonance circuit input node is electrically connected to said second resonance circuit output node;
    an inductor having an input terminal electrically connected to said first resonance circuit input node and an output terminal electrically connected to said first resonance circuit output node; and
    a capacitor having a first terminal electrically connected to said output terminal of said inductor and a second terminal electrically connected to said second resonance circuit input node.

28. The power supply noise reduction circuit according to claim 3, wherein said filter comprises a low-pass filter comprising:
    two serially-connected resistors having an input end connected to a first input terminal of said low-pass filter, a second input terminal of said low-pass filter being commonly-connected to a second output terminal of said low-pass filter;
    a first capacitor having a first terminal connected between said two serially-connected resistors;
    a second capacitor having a first terminal connected to an output end of said two serially-connected resistors and a second terminal connected to said commonly-connected second terminals of said low-pass filter; and
    a voltage follower having a positive input terminal connected to said output end of said two serially-connected resistors and a negative input terminal connected to a second terminal of said first capacitor, an output terminal of said voltage follower connected to a first output terminal of said low-pass filter.

29. The power supply noise reduction circuit according to claim 3, wherein said parallel resonance circuit comprises:
two serially-connected inductors interconnected between a first input terminal of said parallel resonance circuit and a first output terminal of said parallel resonance circuit;
a second input terminal commonly connected to a second output terminal;
two serially-connected capacitors interconnected between said first input terminal and said first output terminal, a midpoint of said two serially-connected capacitors connected to a midpoint of said two serially-connected inductors;
a third capacitor interconnected between said first input terminal and said second input terminal;
a fourth capacitor interconnected between said midpoint of said two serially-connected capacitors and said commonly-connected second input/output terminals; and
a fifth capacitor interconnected between said first output terminal and said second output terminal.

30. The power supply noise reduction circuit according to claim 3, wherein said parallel resonance circuit comprises:
first and second input terminals;
first and second output terminals, commonly interconnected;
an inductor interconnected between said first input terminal and said first output terminal; and
a variable capacitor interconnected between said first and second output terminals.

31. The power supply noise reduction circuit of claim 1, wherein said power supply comprises:
a current source; and
a first capacitor connected in parallel to said current source, said resonance circuit and said filter thereby providing a noise filtering effect without further increase in size of said first capacitor.

* * * * *